US008974967B2

(12) United States Patent
Cui et al.

(10) Patent No.: US 8,974,967 B2
(45) Date of Patent: Mar. 10, 2015

(54) NANOTUBE-BASED NANOMATERIAL MEMBRANE

(75) Inventors: Li-Feng Cui, Palo Alto, CA (US); Yi Cui, Stanford, CA (US); Liangbing Hu, Mountain View, CA (US)

(73) Assignee: The Board of Trustees of the Leland Stanford Junior Univerity, Palo Alto, CA (US)

( * ) Notice: Subject to any disclaimer, the term of this patent is extended or adjusted under 35 U.S.C. 154(b) by 281 days.

(21) Appl. No.: 12/974,552

(22) Filed: Dec. 21, 2010

(65) Prior Publication Data

US 2011/0256451 A1   Oct. 20, 2011

Related U.S. Application Data

(60) Provisional application No. 61/288,708, filed on Dec. 21, 2009.

(51) Int. Cl.
*H01M 4/13* (2010.01)
*H01L 31/00* (2006.01)

(52) U.S. Cl.
USPC ............... 429/231.8; 429/218.1; 429/247; 136/243; 136/252; 977/948

(58) Field of Classification Search
None
See application file for complete search history.

(56) References Cited

U.S. PATENT DOCUMENTS

| 6,334,939 B1 | 1/2002 | Zhou et al. | |
|---|---|---|---|
| 2003/0099884 A1* | 5/2003 | Chiang et al. | 429/233 |
| 2008/0193831 A1* | 8/2008 | Mah et al. | 429/122 |
| 2008/0276987 A1* | 11/2008 | Flood | 136/256 |
| 2009/0117468 A1* | 5/2009 | Eom | 429/231.8 |
| 2009/0185327 A1* | 7/2009 | Seymour | 361/500 |

OTHER PUBLICATIONS

J.P. Maranachi et al. "High Capacity, Reversible Silicon Thin Film Anodes for Lithium-Ion Batteries." Abstract 1295, Electrochemical and Solid State Letters 6, A198, 2003.
J. Yin et al. "Micrometer-Scale Amorphous Si Thin-Film Electrodes Fabricated by Electron Beam Deposition for Li-Ion Batteries." Journal of the Electrochemical Society 153, A472. Abstract only, 2006.
S.H. Ng et al. "Single wall carbon nanotube paper as anode for lithium-ion battery." Electrochimica Acta 51, 23. Abstract Only, 2005.
L.F. Cui et al. "Crystalline-Amorphous Core-Shell Silicon Nanowires for High Capacity and High Current Battery Electrodes." Nano Letters 9, 491, 2009.
L.F. Cui etal. "Carbon—Silicon Core-Shell Nanowires as High Capacity Electrode for Lithium Ion Batteries." Nano Letters 9, 3370 (Aug. 2009), 2009.
M.N. Obrovac and L.J. Krause. "Reversible Cycling of Crystalline Silicon Powder." Journal of the Electrochemical Society 154, A103, Abstract Only, 2007.

(Continued)

*Primary Examiner* — Cynthia K. Walls
(74) *Attorney, Agent, or Firm* — Crawford Maunu PLLC

(57) ABSTRACT

As consistent with various embodiments, an electronic device includes a carbon nanotube film having a plurality of carbon nanotubes. In certain embodiments, a coating, such as an inorganic coating, is formed on a surface of carbon nanotube. The nanotube film supports the device and facilitates electrical conduction therein. The coated nanotube is amenable to implementation with devices such as thin film batteries, a battery separator, thin film solar cells and high-energy Lithium ion batteries.

29 Claims, 15 Drawing Sheets

(56) References Cited

OTHER PUBLICATIONS

S. Ohara et al. "Attainment of High Rate Capability of Si Film as the Anode of Li-ion Batteries." Electrochemistry 71(12), 1126, Abstract Only, 2003.

S. Komaba et al. "Improvements of Electrochemical Capability of Sputtered Silicon Film Anode for Rechargeable Lithium Batteries." Bulletin of the Chemical Society of Japan 79, 154, 2006.

* cited by examiner

Free-standing CNT-Si film

NANOTUBE-BASED NANOMATERIAL MEMBRANE

RELATED PATENT DOCUMENTS

This patent document claims the benefit, under 35 U.S.C. §119(e), of U.S. Provisional Patent Application Ser. No. 61/288,708 filed on Dec. 21, 2009, and entitled "Nanotube-based Nanomaterial Membrane;" this patent document and the Appendix filed in the underlying provisional application, including the references cited therein, are fully incorporated herein by reference.

FIELD OF INVENTION

The present disclosure relates to nanomaterial membranes, and more particularly, to membranes having nanotube-based materials.

BACKGROUND

Energy storage and energy conversion has become increasingly important, particularly as energy demands have increased while environmental concerns relating to the production of energy have also increased. For instance, batteries have become increasingly important as a source of power for a variety of applications, such as automotive applications. Batteries have also seen widespread growth in their use in connection with a variety of devices, and particularly for hand-held devices. Energy conversion, such as for solar cell applications, has also become increasingly important as the demand for environmentally-friendly energy sources increases.

While the demand for energy storage and conversion solutions has increased, currently available products have various drawbacks, relating to cost, size, function and environmental impact. These issues continue to present challenges to the production and implementation of energy storage and energy conversion circuits.

Various aspects of the present disclosure are directed to devices, methods and systems involving a nanomaterial membrane having nanotubes, such as carbon nanotubes, in a manner that addresses challenges including those discussed above.

SUMMARY

According to an example embodiment, an electronic device includes a carbon nanotube film having a plurality of carbon nanotubes, an inorganic coating on the carbon nanotube film, and a conductive electrode coupled to the carbon nanotube film for conducting current therefrom. In some implementations, the conductive electrode includes at least a portion of the carbon nanotube film.

According to another example embodiment, a carbon-nanotube device is manufactured as follows. Carbon nanotubes are dispersed in a solvent to form a carbon nanotube ink. The carbon nanotube ink is applied to a substrate, and the carbon nanotube ink is dried to form a carbon nanotube film. The carbon nanotube film is immersed to release the film from the substrate, and an inorganic coating is deposited on the carbon nanotube film.

In connection with another example embodiment, a thin-film battery device includes a conduction channel including a carbon nanotube film, and an electrode including an amorphous silicon coating coupled to the carbon nanotube film of the conduction channel.

In certain example embodiments, a battery has a carbon nanotube film, at least one of a cathode material and an anode material coated on the carbon nanotube film, and an insulative material coated on the carbon nanotube film and configured to electrically insulate the carbon nanotube film. The carbon nanotube film can form a current collector of the battery, and in other implementations, the battery can include a separate current collector.

Also, aspects concern a thin-film solar cell that includes an n-type silicon material and a thin film on the n-type silicon material with p-type carbon nanotubes that form a p-n junction with the n-type silicon material. Electrodes couple to the n-type silicon material and the p-type carbon nanotubes and couple current generated at the p-n junction in response to light.

Various other aspects of the disclosure are directed to embodiments described and/or shown in the Appendix filed in the underlying provisional application and entitled "Carbon Nanotube Reinforced Silicon Films as High Capacity Anode for Lithium Ion Batteries." For instance, aspects of the disclosure relate to structural components and/or methods of manufacturing as described in the Appendix, and which is incorporated herein by reference.

The above summary is not intended to describe each embodiment or every implementation of the present disclosure. The figures and detailed description that follow more particularly exemplify various embodiments.

BRIEF DESCRIPTION OF THE DRAWINGS

The disclosure may be more completely understood in consideration of the following detailed description of various embodiments of the disclosure in connection with the accompanying drawings, in which:

FIGS. 14A-4D are SEM images of the free-standing CNT-Si films after different number of cycles, according to certain example embodiments of the present disclosure.

Figure 1:
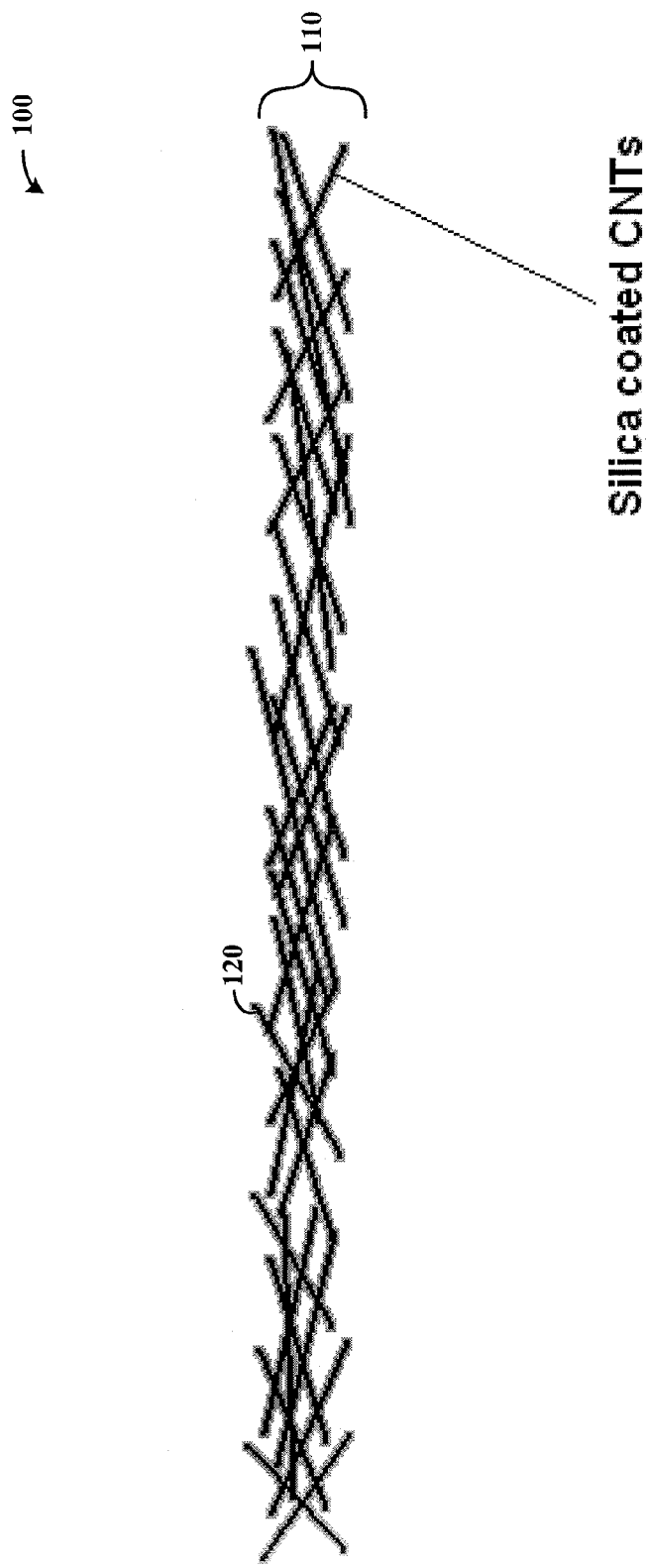
FIG. 1 shows a carbon nanotube-based separator structure, consistent with certain example embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described.

DETAILED DESCRIPTION

The present disclosure is believed to be useful for applications involving nanomaterials, such as membranes, and their use in a variety of applications. Aspects of the present disclosure have been found to be very useful and advantageous in applications involving various types of batteries and solar cells (e.g., thin film types), high-energy Lithium ion batteries and components of batteries and solar cells. While the present disclosure is not necessarily limited to such applications, various aspects of the disclosure may be appreciated through a discussion of various examples using this context.

According to an example embodiment, a carbon nanotube film-based circuit arrangement is configured for one or both of energy conversion and energy storage. The carbon nanotube film is a backbone for depositing one or more other materials, such as Silicon, $LiCoO_2$, inorganic nanoparticles and others. The carbon nanotubes are used as the mechanical support and electrical conductor, while the one or more other materials tailor the circuit for use in one or more of a variety of functions.

Contact to the carbon nanotube film-based circuit arrangement is made in one or more of a variety of manners. In some applications, an electrode is coupled to the carbon nanotube film and the film is used as a conductor for the circuit arrangement (e.g., with circuit routing to provide external contact).

Another example embodiment is directed to a battery electrode having carbon nanotube film electrodes. The carbon nanotubes are coated with amorphous silicon and form a collector for one or both of anode or cathode sides of the battery. When coupled to a load, the carbon nanotubes function as a conduction channel.

According to another example embodiment, a battery separator includes a carbon nanotube film having silicon and/or other inorganic materials such as SiN coated thereupon. The inorganic material is insulating, while CNTs maintain the mechanical flexibility and pore size. In some implementations, the coating has a thickness of about 100 nm.

In another example embodiment, a thin-film solar cell includes a carbon nanotube membrane including p-type carbon nanotubes coated with n-type amorphous silicon. The carbon nanotubes and amorphous silicon form a p-n junction at which current is generated in response to the application of light. For instance, when photons are absorbed in the thin-film solar cell, an electron-hole pair is generated. These carriers are separated in the electric field near the p-n junction, and electrons flow through a load coupled across the n-type silicon and the p-type carbon nanotubes to travel back to recombine with the generated holes.

According to an example embodiment, a conductive nanomaterial, such as metal nanoparticles and/or transparent and conductive oxide (TCO) nanoparticles, is coupled to a nanotube film. In some implementations, the conductive nanomaterial is mixed with the carbon nanotubes to form a solution and the solution is coated on a substrate, and removed from the substrate after drying (as described above). In other implementations, the conductive nanomaterial is formed on the carbon nanotube film, after formation of the carbon nanotube film.

In some implementations, pseudocapacitor materials such as $RuO_2$, $MnO_2$ and other oxides or conductive polymers are coated upon a carbon nanotube film as described herein, using the nanotube film as a support structure to form a device including the pseudocapacitor materials. The pseudocapacitor-coated film can be implemented in connection with various electronic devices and applications, such as with one or more of the battery and supercapacitor embodiments, and used as anode and/or cathode components, such as a current collector.

In some embodiments, materials such as inorganic nanoparticles are coated upon opposing faces of a carbon nanotube film as described herein, again using the film as a support structure. Each respective face of the carbon nanotube may be coated with different material, depending upon the expected implementation of the device. In certain applications, the carbon nanotube film is coated with anode and/or cathode materials, and the nanotubes act as a conductor for the anode and/or cathode of a battery.

According to another example embodiment, a multi-layer energy device includes a carbon nanotube film as described above on a separator electrolyte material. The carbon nanotube film is coated with an insulating material, and acts as one or more of an anode or cathode material for the multi-layer energy device. In some applications, the multi-layer energy device is a supercapacitor, with coatings on the carbon nanotube film facing a separator, and a coating on the nanotubes forming an electrode of the supercapacitor.

In some implementations, the multi-layer energy device is a battery, with electrodes coated upon the carbon nanotube film. In some implementations, the carbon nanotube film acts as a conductor and is coated with active battery materials that may include, for example, cathode material such as $LiCoO_2$, $LiMn_2O_4$, and anode material such as $Li_4Ti_6O_2$. In some implementations, the carbon nanotube film is used as a current collector for large scale energy storage devices.

As used herein and unless otherwise stated, the term cathode is used to identify the positive electrode/terminal and anode is used to identify the negative electrode/terminal of a battery or cell. The term battery is used to denote a collection of one or more cells arranged to provide electrical energy. The cells of a battery can be arranged in various configurations (e.g., series, parallel and combinations thereof).

Carbon nanotube films as discussed herein can be formed using one or more of a variety of approaches. In one embodiment, single walled or multi-walled carbon nanotubes are dispersed in organic solvent or water with the aid of surfactants to form a carbon nanotube ink. The carbon nanotube ink is applied to a flat substrate, such as metal with high surface energy, using a method such as the scalable Mayer rod or slot die coating method. In one example, a Mayer rod coating approach involves dropping CNT ink onto the substrate, and rolling the rod across the substrate. The thickness of dried CNT film can be controlled by the ink concentration and the wire size of Meyer rods.

After the film is dried, the film on substrate is immersed in water and gently shaken mechanically. The carbon nanotube film peels off from the substrate. Using the hydrophobic nature of carbon nanotubes after the removal of the surfactant, the carbon nanotube film tends to flow on the top of the water surface. A metal mesh is used to pick up the free standing carbon nanotube films in water for Silicon deposition.

In some implementations, the carbon nanotubes are held together via inter-nanotube forces, such as van der Waals forces, and as may be further facilitated by their dispersion in a solution such as to form an ink. Other bonding or coupling techniques may also be used, such as by including bonding material in the organic solvent or water.

In connection with another example embodiment, an amorphous Silicon coating is formed on free-standing carbon nanotube films. In one implementation, the coating is formed using a chemical-vapor-deposition (CVD) furnace. Free-standing carbon nanotube films are set in a tube furnace, such as a furnace using a 1-inch quartz tube. The furnace is pumped to vacuum, purged with pure argon then heated to the desired temperature. A compressed gas mixture of 2% Silane balanced in Argon was flowed to deposit Silicon onto the carbon nanotube films. Flow rates between 0.1 sccm and 2000 sccm can be used for delivering of $SiH_4/Ar$ gas. The pressure is set between about 0.1 Torr and 1000 Torr and CVD temperature is set between 300° C. and 1000° C. The thickness of the Si coating is controlled by the CVD time.

Another implementation is directed to depositing Silicon using plasma-enhanced-chemical-vapor-deposition (PECVD). PECVD can be a cheaper and faster process compared to CVD. Silicon is coated onto carbon nanotube films using a large scale roll-to-roll process.

Another example embodiment is directed to a carbon nanotube-based device configured with an internal carbon nanotube membrane as described herein, which maintains structural integrity and conductivity of the device. The carbon nanotube membrane is configured to deflect (e.g., ripple) to release strain, such as strain that occurs due to large volume changes during Lithium cycling (insertion and extraction) for battery operation. In some implementations, the carbon nanotube membrane is made on a stainless steel mesh, and in other implementations, as a free-standing membrane. The number of carbon nanotubes can be varied based upon the application, and in some implementations, the carbon nanotubes contribute less than about 15% of the overall mass to the device, with a Silicon around the carbon nanotubes being a larger component of the device. Further embodiments and implementations regarding such membranes, structural integrity, and strain release are described in the above-referenced Appendix.

Turning now to the figures, FIG. 1 shows a carbon nanotube-based separator structure 100, consistent with another example embodiment of the present disclosure. The separator structure includes a carbon nanotube film 110 having a plurality of carbon nanotubes 120 that mechanically support the structure 100. The carbon nanotubes are conformably coated with inorganic materials such as $Al_2O_3$ or $SiO_2$ using an approach such as sputtering, e-beam deposition or atomic layer deposition (ALD). The final film, after the conformal coating, is electrically insulating.

In some implementations, another coating is applied to the coated carbon nanotube film to further increase the thickness of the free-standing membrane. For example, nanoparticles having certain pore sizes can be coated for a variety of purposes, such as to facilitate the transport of electrolytes (e.g., nanoparticles having a pore size of about 1-100 nm).

Figure 2:
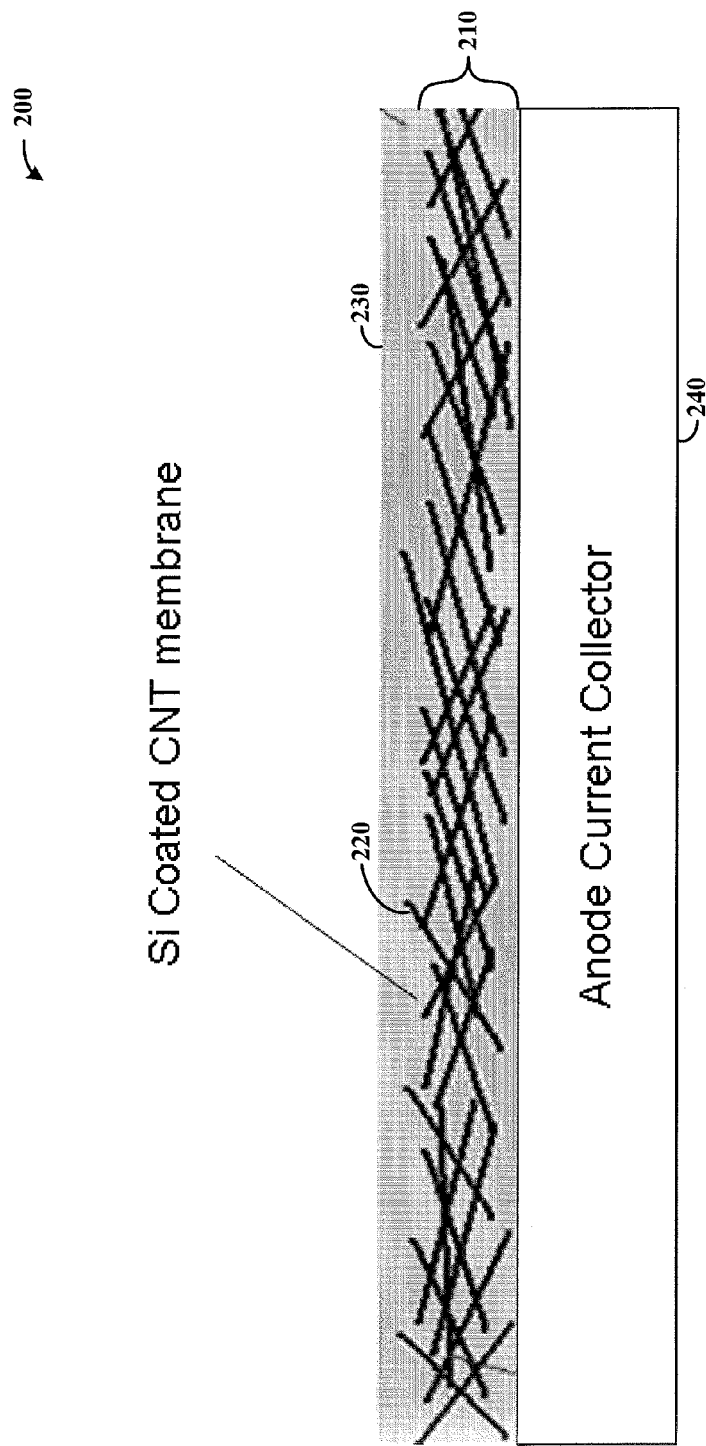
FIG. 2 shows a carbon nanotube-based anode structure, also consistent with certain example embodiments of the present disclosure.

FIG. 2 shows a carbon nanotube-based anode structure 200, consistent with another example embodiment of the present disclosure. The anode structure 200 includes a carbon nanotube film 210 having a plurality of carbon nanotubes, including nanotube 220 which is labeled for reference. The film 210 is coated with an inorganic material 230 such as amorphous Silicon, using a process such as CVD or PECVD, and can be coated on both sides. The thickness of the coating 230 varies depending upon the application, and in some instances, is between about 50 nanometers and 10 micrometers. The film is further located on an anode current collector 240.

Figure 3:
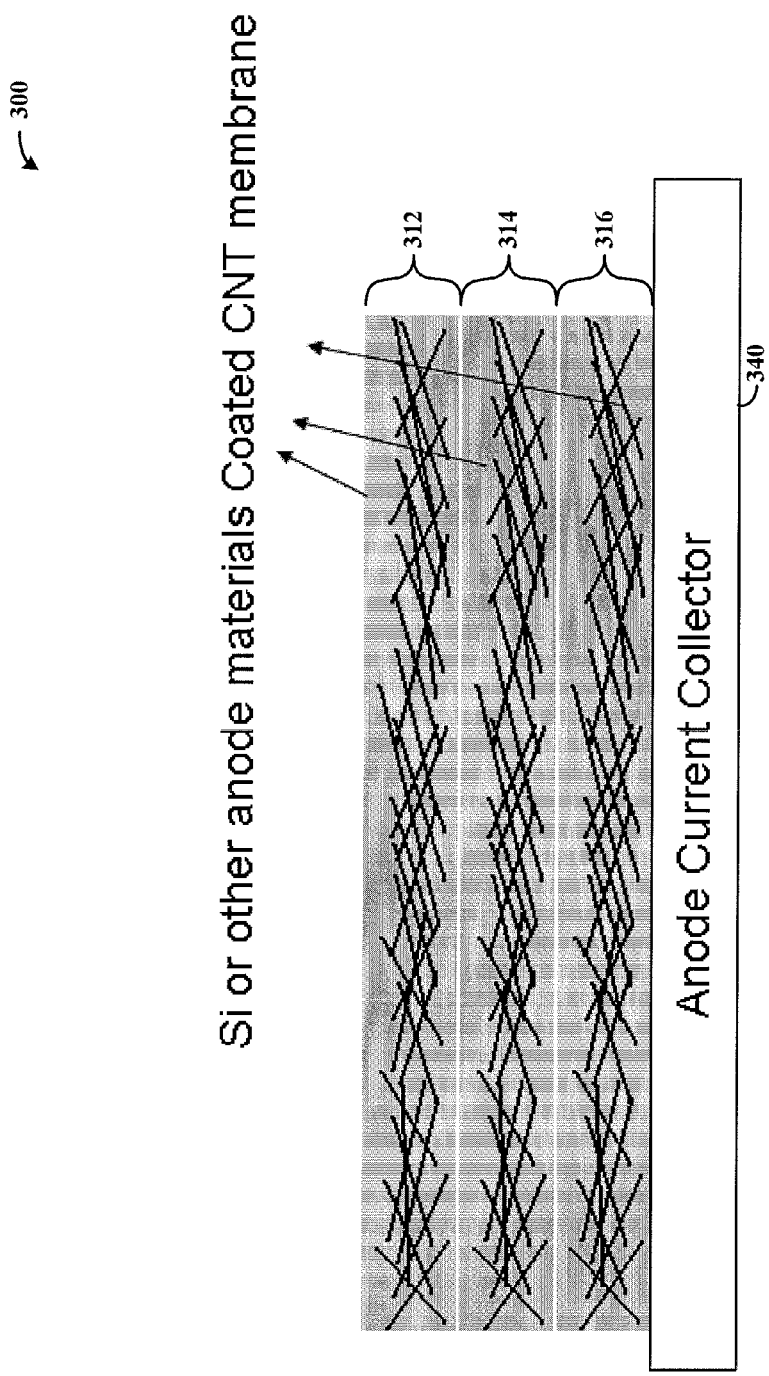
FIG. 3 shows a multilayer, carbon nanotube-based anode structure, also consistent with certain example embodiments of the present disclosure.

FIG. 3 shows a cross-section of a multilayer, carbon nanotube-based anode structure 300, consistent with another example embodiment of the present disclosure. The anode structure 300 includes a multilayer carbon nanotube film structure including carbon nanotube membranes 312, 314 and 316, each respectively including a coated carbon nanotube film and stacked over/on an anode current collector 340. The respective coated membranes may, for example, be implemented in a manner that is similar to that shown in FIG. 2, with carbon nanotube film 210 coated with an inorganic material 230

In some instances, the membranes 312, 314 and 316 include a folded membrane having a continuous film of carbon nanotubes, coated and folded to form the cross-section as shown. In other instances, the membranes 312, 314 and 316 are separate, respectively including separate, coated carbon nanotube films. The multilayer structure exhibits relatively high mass loading (e.g., relative to a single layer of a coated carbon nanotube film).

Figure 4:
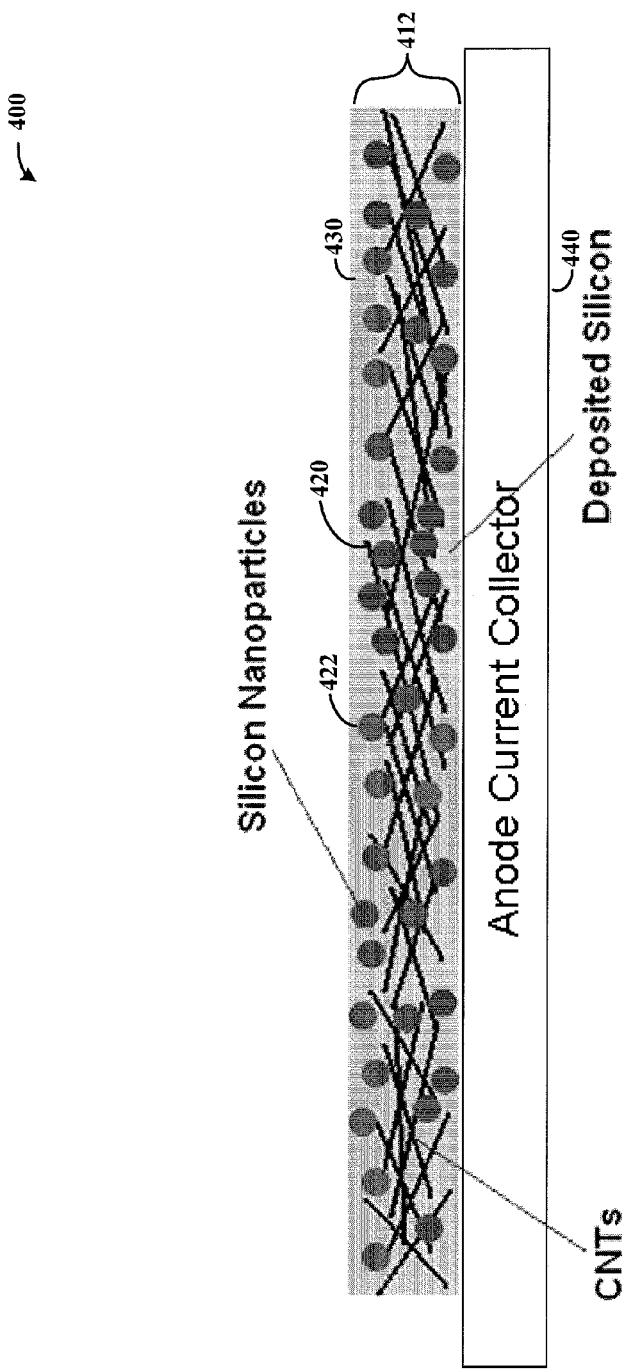
FIG. 4 shows a carbon nanotube-based anode electrode structure with a composite film, consistent with certain example embodiments of the present disclosure.

FIG. 4 shows a carbon nanotube-based anode electrode structure 400 having a composite carbon nanotube-based membrane 412 on an anode current collector 440. The carbon nanotube-based membrane 412 includes a carbon nanotube film having a plurality of carbon nanotubes (with nanotube 420 labeled by way of example), having Silicon nanoparticles 422 coupled thereto and further coated with an inorganic material 430. In some implementations, the Silicon nanoparticles 422 are coated onto the carbon nanotube film, and Silicon is coated onto the nanoparticle-coated nanotube film to form the inorganic material 430. The Silicon nanoparticles 422 facilitate a relatively high mass loading of Silicon per area of the anode electrode structure 400 under desirable CVD (or other deposition) process conditions.

Figure 5:
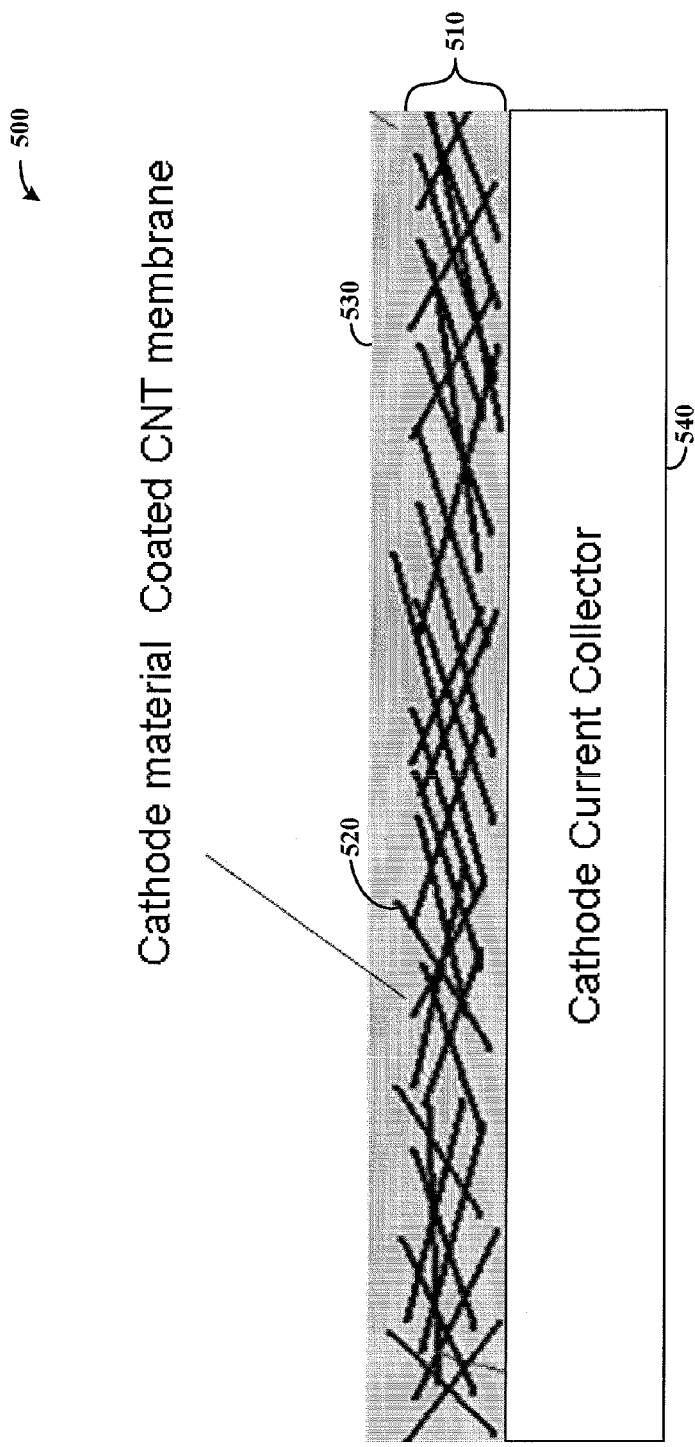
FIG. 5 shows a carbon nanotube membrane-based cathode structure, consistent with certain example embodiments of the present disclosure.

FIG. 5 shows a carbon nanotube membrane-based cathode structure 500, consistent with another example embodiment of the present disclosure. The cathode structure 500 includes a carbon nanotube film 510 having a plurality of carbon nanotubes, including nanotube 520 which is labeled for reference. The carbon nanotube film 510 is coated with a cathode material 530 such as $LiMnO_2$ or $LiCoO_2$, which can be coated, for example, using a coating process such as sputtering or slurry application. The coated film 510 is located on or over a cathode current collector material 540.

Figure 6:
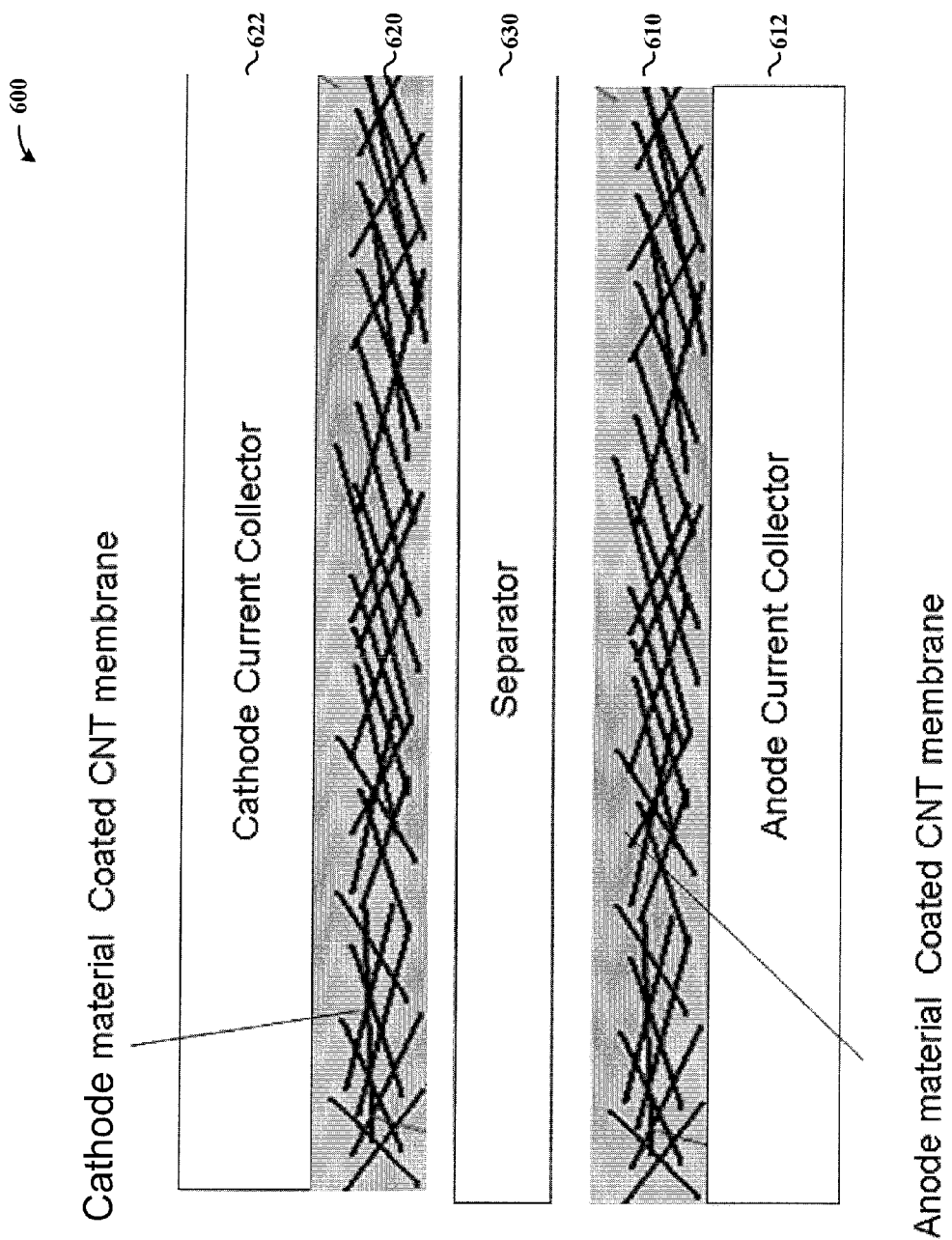
FIG. 6 shows a carbon nanotube membrane-based battery, consistent with certain example embodiments of the present disclosure.

FIG. 6 shows a carbon nanotube membrane-based battery 600, consistent with another example embodiment of the present disclosure. The battery 600 includes an anode membrane 610 and a cathode membrane 620 separated by a separator 630 (e.g., an electrolytic separator). The anode and cathode membranes 610 and 620 are respectively coupled to anode and cathode current collectors 612 and 622. Each of the respective anode and cathode membranes 610 and 620, together with their respective current collectors, may be implemented using anode and cathode structures 200 and 500 as shown in FIGS. 2 and 5.

Figure 7:
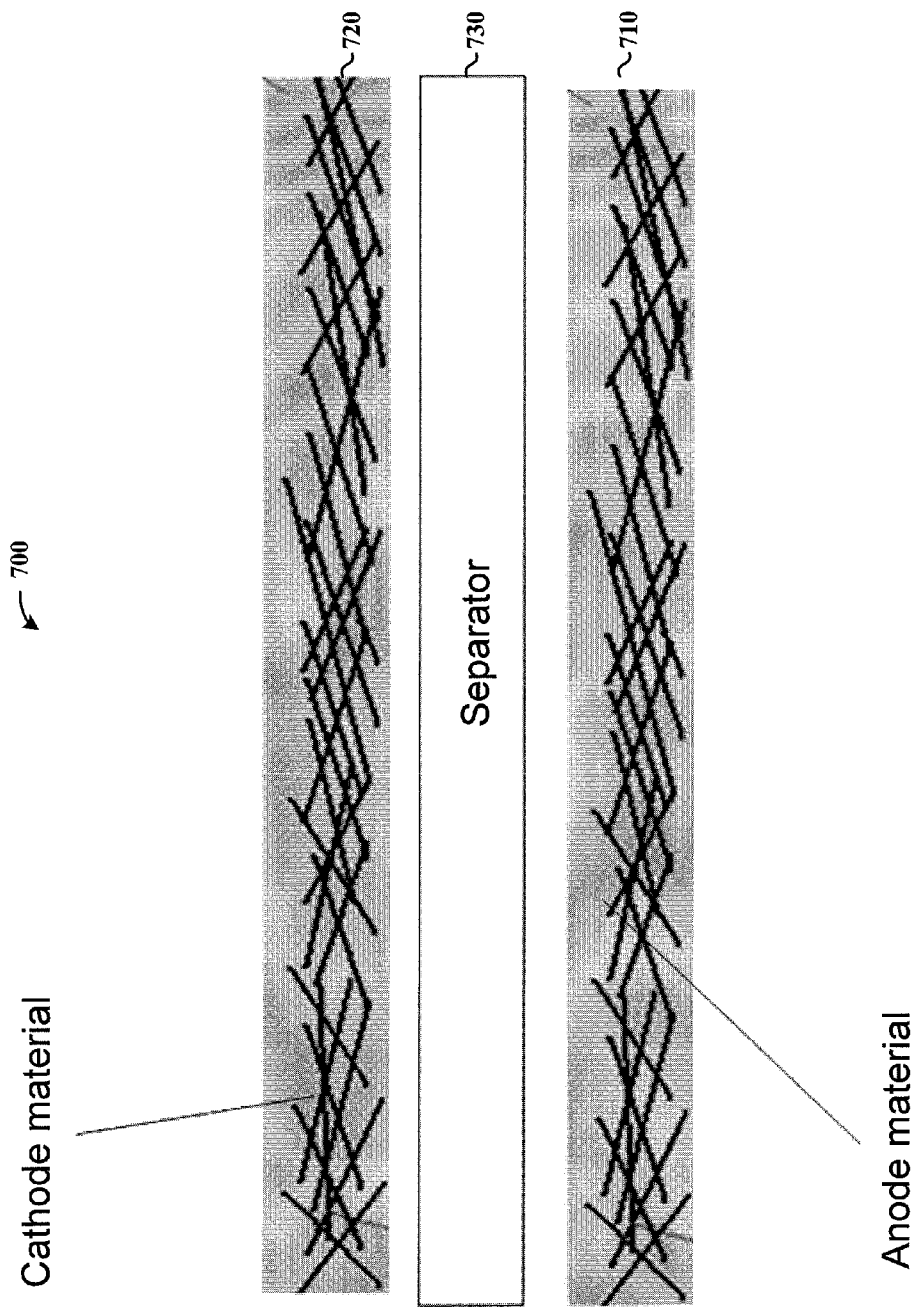
FIG. 7 shows a carbon nanotube membrane-based battery with the membranes used as both electrode and current collector, consistent with certain example embodiments of the present disclosure.

FIG. 7 shows a carbon nanotube membrane-based battery 700 with the membranes used as both electrode and current collector, consistent with another example embodiment of the present disclosure. The battery 700 includes anode membrane 710 and cathode membrane 720, separated by a separator 730. Each of the respective anode and cathode membranes 710 and 720 act as both an electrode and current collector for anode and cathode sides of the battery 700. Carbon nanotube-based films in each membrane function as an electrode current collector. As illustrated, the structures 710 and 720 can be considered to be coated CNT membranes.

Figure 8:
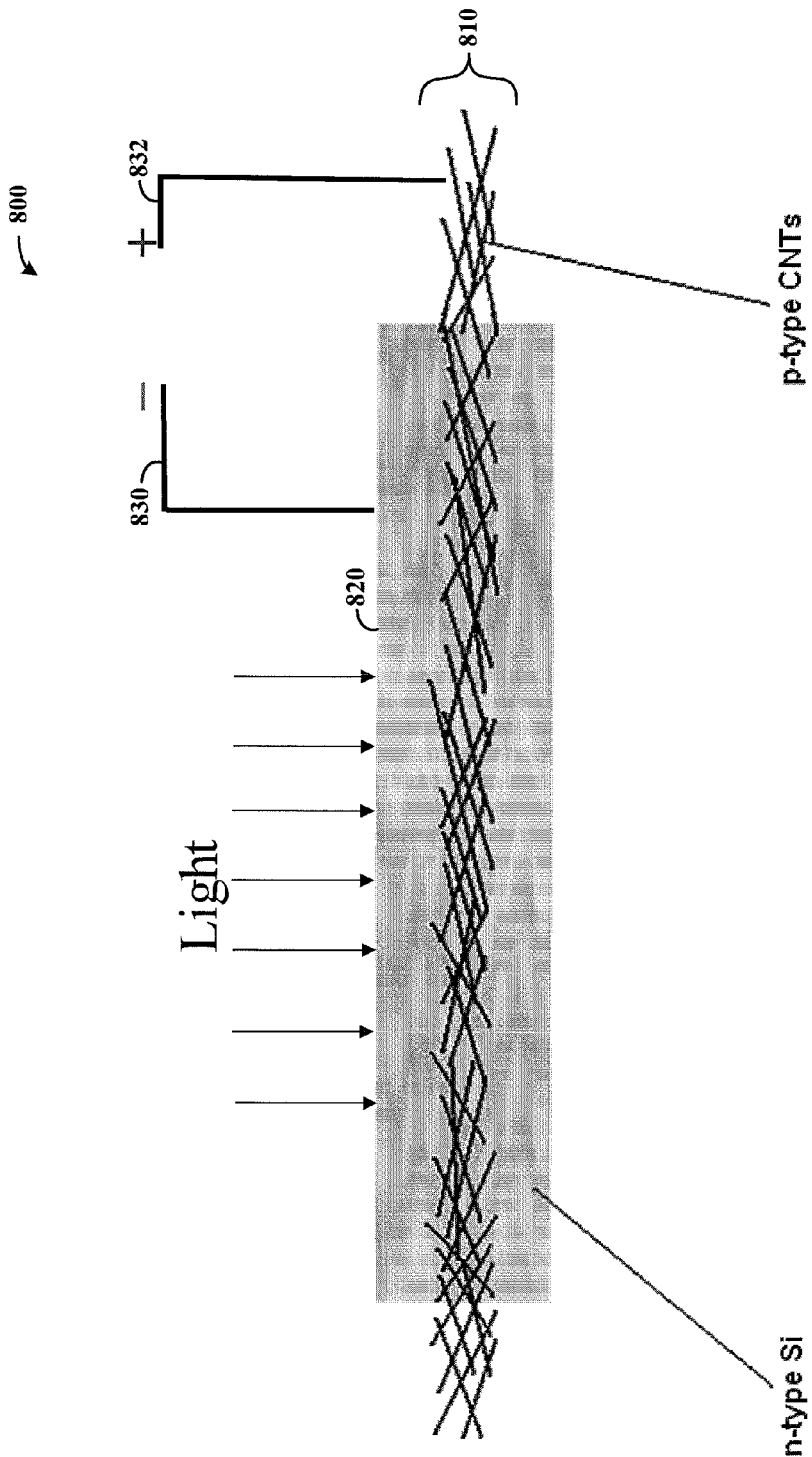
FIG. 8 shows a carbon nanotube-based solar cell structure having n-type materials and p-type carbon nanotubes, consistent with example embodiments of the present disclosure.

FIG. 8 shows a carbon nanotube-based solar cell structure 800 having a carbon nanotube membrane 810 and a coating 820, consistent with another example embodiment of the present disclosure. The carbon nanotube membrane 810 includes a plurality of p-type carbon nanotubes, which are coated with an n-type material coating 820 to form a p-n junction, such as discussed in connection with solar cells above. Electrodes 830 and 832 are respectively coupled to the n-type material coating 820 and the p-type carbon nanotube membrane 810, for connection to an external load. In some implementations, the n-type material coating 820 includes a Silicon coating having a thickness in the range of about 1-10 micrometers. In response to light, carriers generated near the p-n junction are collected and flow via electrodes 830 and 832 to a load connected thereto.

Figure 9:
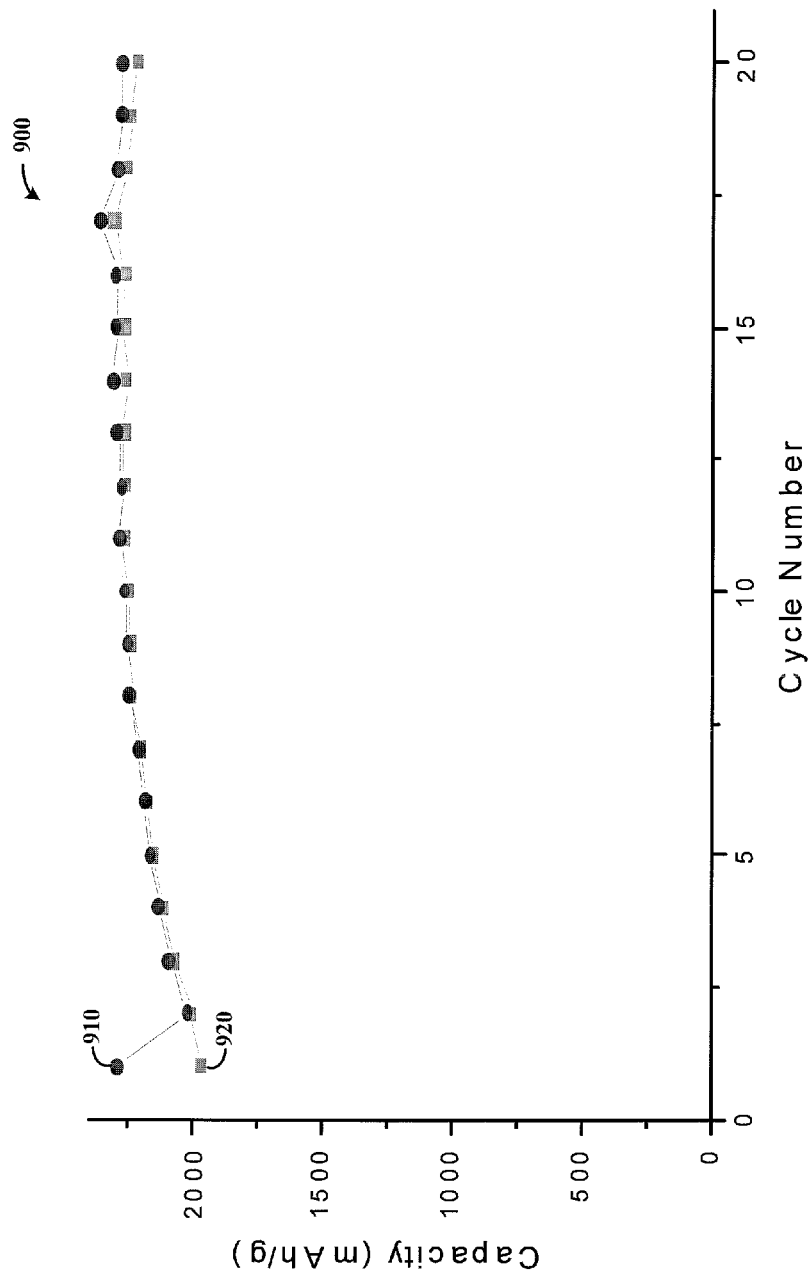
FIG. 9 shows a plot of cycling performance for a carbon nanotube-based composite film, consistent with example embodiments of the present disclosure.

FIG. 9 shows a plot 900 of cycling performance for a coated carbon nanotube-based composite film, consistent with another example embodiment of the present disclosure. The film may, for example, be coated with Silicon. Charge cycling is represented by circle plot points (including point 910), and discharge cycling is represented by square plot points (including point 920).

Figure 10:
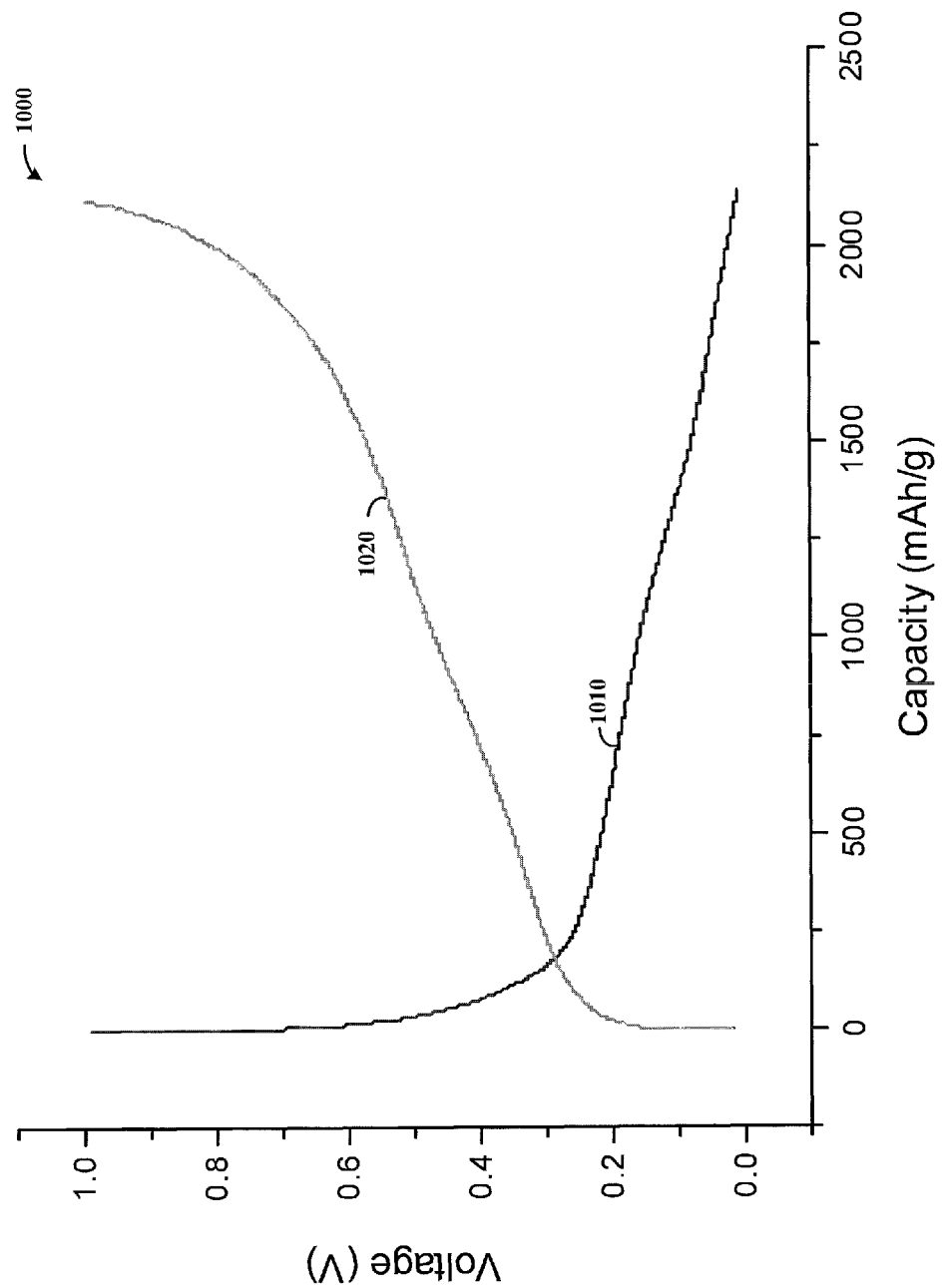
FIG. 10 shows a plot of charge and discharge for a carbon nanotube-based free-standing film, consistent with example embodiments of the present disclosure.

FIG. 10 shows a plot 1000 of charge (red, 1010) and discharge (green, 1020) for a carbon nanotube-based free-standing film, consistent with another example embodiment of the present disclosure. The carbon nanotube-based film is coated with a material such as Silicon.

EXPERIMENTAL/MORE-DETAILED EMBODIMENTS

Consistent with the above-discussed embodiments, for the following experimental/more-detailed embodiments silicon is used as an attractive alloy-type anode material because of its highest known capacity (4,200 mAh/g). However, lithium insertion into and extraction from silicon are accompanied by a huge volume change up to 300%, which induces a strong strain on the silicon particles and causes pulverization and rapid capacity fading. These embodiments use carbon nanotube-silicon (CNT-Si) composite films as high capacity anode material. CNT-Si composite films up to 4 µm in thickness are synthesized by $SiH_4$ chemical vapor deposition (CVD) on pure CNT films. The composite film has a structure that can be considered akin to the steel bar reinforced concrete, where the infiltrated CNT network functions as mechanical support and provides good conductivity, flexibility as well as mechanical strength. It can be made on a stainless steel mesh or free standing and used as anode electrodes. This composite film has a high specific charge storage capacity (about 2000 mAh/g) and a good cycling life, superior to pure sputtered-on silicon films with similar thickness. The advantageous performance can be attributed to the good mechanical strength and conductivity of the composite film, which can maintain structural integrity upon repeated lithium insertion and extraction. Scanning electron micrographs show that the composite film is still connected by CNT network even if small breaking or cracks appear in the film after cycling. The composite film can even "ripple up" to release the strain of large volume change during lithium cycling.

In certain embodiments, silicon as an anode material is used because it has the highest-known capacity, more than 10 times the value of the current commercial graphite anode. Due to the volume change of Si during lithium cycling, the ensuing pulverization and rapid capacity fading can be limiting in terms of practical applications. To help address this, certain aspects of the present disclosure involve use of Si nanowires (SiNWs) as anodes to significantly improve the performance of the Si anode. Through this approach, we have demonstrated excellent and surprising performance levels with SiNWs directly grown on metal current collector by a vapor-liquid-solid method. SiNWs can relax the strain and overcome the problem of pulverization, maintain direct electrical connection with current collector and have short diffusion distance for lithium insertion. We have also designed core-shell SiNWs as high performance anode, where the thin core is either crystalline Si (c-Si) or amorphous carbon and the thick shell is made of amorphous Si (a-Si).

In these core-shell NWs, the core functions as efficient electron transport pathways and stable mechanical support whereas the a-Si shell provides the high $Li^+$ storage capacity. In the current study we report a novel approach using carbon nanotube-silicon (CNT-Si) composite films as high capacity anode. The composite film has a structure similar to steel bar reinforced concrete, where CNT network is infiltrated in Si film and provides good conductivity, flexibility as well as mechanical strength. The Si in CNT-Si film can be either a-Si from $SiH_4$ CVD or crystalline Si nanoparticles (SiNPs). Since the $SiH_4$ CVD is a quite expensive process, incorporation of SiNPs is desired in real applications. Good battery performance has been obtained using the CNT-Si films as anode.

Figure 11:
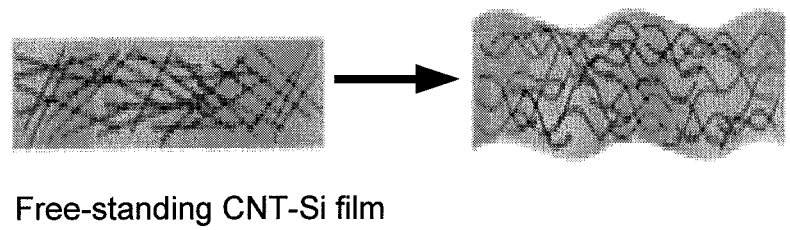
FIG. 11 shows how free-standing carbon nanotube-Si films can change their shape, configuration and arrangement, e.g., "rippling up", to relax large strain during Li+ cycling, also consistent with example embodiments of the present disclosure.

In previous studies using Si films as anode for lithium ion batteries, Si was deposited on metal substrates (current collector) by various sputtering methods. When very thin Si film is used, the strain in Si induced by lithium intercalation is relatively small and pulverization is limited. Great cycling performance (>200 cycles) has been obtained on very thin (thickness<500 nm) sputtered-on a-Si films. See, e.g., J. P. Maranchi, A. F. Hepp, and P. N. Kumta, Electrochemical and Solid State Letters 6, A198 (2003). However the low material loading density per unit area of these very thin films can prevent their practical application. When relatively thick Si films (thickness>2 µm) were used, fast capacity fading was observed. See, e.g., Id. This is because the large strain in the thick Si film during $Li^+$ cycling severely pulverizes the film and causes loss of contact of part of the Si with substrate. Others such as J. T. Yin et al. have sputtered relatively thick a-Si film (thickness>2 µm) on roughened copper substrate and obtained improved performance. See, J. T. Yin, M. Wada, K. Yamamoto, et al., Journal of the Electrochemical Society 153, A472 (2006). They attributed this improvement to the reduction of strain in Si during $Li^+$ cycling on a roughened surface. In connection with the present disclosure, a CNT-Si composite film is synthesized for the anode of lithium ion batteries. CNTs are infiltrated in a Si film and function as a structural reinforcement and also as a conductive network. The composite film has a structure similar to steel bar reinforced concrete showing great strength and flexibility. This composite film can be made either on stainless steel (SS) mesh or free-standing. The good flexibility allows the film to "ripple up" in order to relax the large strain during $Li^+$ cycling, as indicated in FIG. 11. Relatively thick CNT-Si composite films (in microns up to 4 μm) still show good cycling performance. In these composite films, CNT contributes less than 15% of the overall mass and Si is the major component. In other related embodiments, multiple layers of these CNT-Si films are stacked for an anode structure, thereby providing and yielding high active material loading density per unit area. Two layers of this composite film with a total thickness of 8 μm will have an area capacity larger than 4 mAh/cm$^2$, which satisfies the typical commercially-acceptable level or standard.

Figure 12:
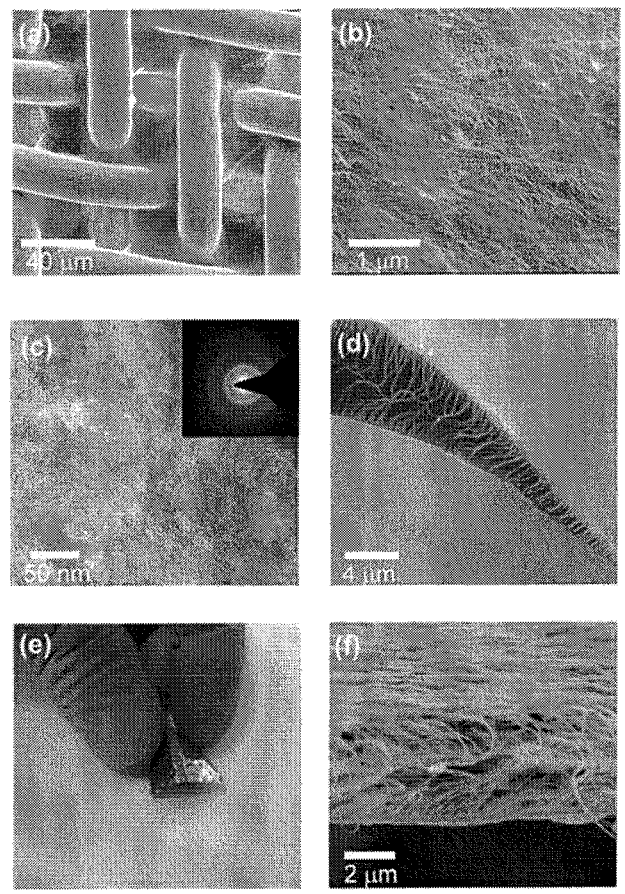
FIGS. 12A-F are images illustrating aspects consistent with example embodiments of the present disclosure.

In one experiment, CNT-Si composite films were made by depositing a-Si on pure CNT films or mixed CNT-SiNP films. We first made SS mesh supported CNT films by dipping a SS 500 mesh in an aqueous CNT ink followed by drying. Free-standing CNT films (see images in FIG. 12A showing a 40 micron scale) were made by delamination of a dried CNT film on a smooth SS substrate, which was dip-coated with CNTs using an ink. The SS mesh supported CNT films or free-standing CNT films were put inside a SiH$_4$ CVD furnace to be deposited with a-Si. The amount of a-Si deposited can be controlled by the CVD time. Since larger Si content provides higher specific charge storage capacity, we usually control the mass ratio of Si:CNT to be greater than 6.1 Free-standing CNT-SiNP composite films are also made employing the above approach and using an aqueous ink that contains both SiNPs and CNTs, with a mass ratio of 6:1. However when used as anode for lithium ion cells, the free-standing CNT-SiNP films have a large irreversible capacity for the first cycle and poor cycling performance (see FIG. 12B showing a 1 micron scale). Previous studies using CNTs as anode for lithium ion batteries found a very high irreversible capacity (>1200 mAh/g) for the first cycle. This is because the majority of reaction of Li$^+$ with CNT surfaces is irreversible. See, e.g., S. H. Ng, J. Wang, Z. P. Guo, et al., Electrochimica Acta 51, 23 (2005). The poor cycling performance may also be due to the loose contact between CNTs and SiNPs.

We also performed SiH$_4$ CVD to coat the CNTs and SiNPs with a thin layer of a-Si, which can fuse all the CNTs and SiNPs together to form an integrated film. After a short time of CVD treatment, the CNT-SiNP films no longer show a large irreversible capacity and good battery performance was obtained. In view of SEM images of a CNT-SiNP film before and after SiH4 CVD treatment, the deposited a-Si has passivated the surface of CNTs and the irreversible reaction with Li$^+$ is believed to be reduced. The incorporation of SiNPs offers the advantage of using SiNPs as the major Si content instead of deposited a-Si from SiH$_4$CVD, which is an expensive process.

We first made a CNT-Si composite film on a SS 500 mesh as shown by the SEM image of FIG. 12A. The SEM image clearly shows a film (or membrane) lying on the SS grids. FIG. 12B is a zoom-in SEM image of the film, where CNT induced wire structures can be identified although the spaces between wires are filled with a-Si forming a continuous film. FIG. 12C is a TEM image of about 1 μm thick CNT-Si film supported by SS mesh (using a 50 micron scale). No real clear CNTs can be seen because the majority of film content is a-Si. The inset image in FIG. 12C is a selected area electron diffraction image of the film. No crystalline diffraction pattern is observed for this film indicating the deposited Si is amorphous in nature. FIG. 12D is a SEM image of a broken CNT-Si film, where CNTs can be clearly seen connecting the two broken pieces. From the image, even when the composite film is broken to certain degree the broken pieces are still connected by a CNT network. This behavior is exactly similar to the steel bar reinforced concrete, where steel bar provides flexibility and extraordinary fracture resisting strength. FIG. 12E shows a photograph of a free-standing CNT-Si composite film, which does not break upon bending. FIG. 12F is a cross section SEM image of the free standing CNT-Si film, where the film thickness is about 4 μm and CNTs at the broken edge can be clearly seen.

Figure 13:
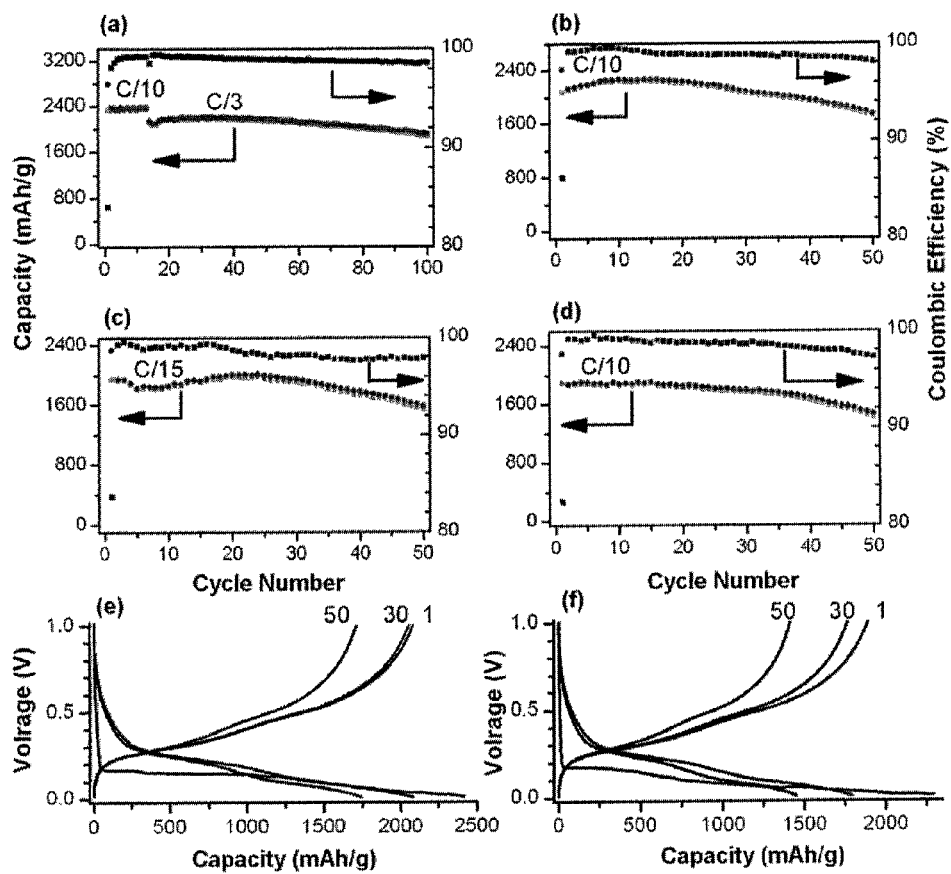
FIGS. 13A-13F are plots showing parameters or attributes (capacity, coulombic efficiency and voltage profile) of CNT-Si films as anode in half cell tests, according to certain example embodiments of the present disclosure.
Figure 15:
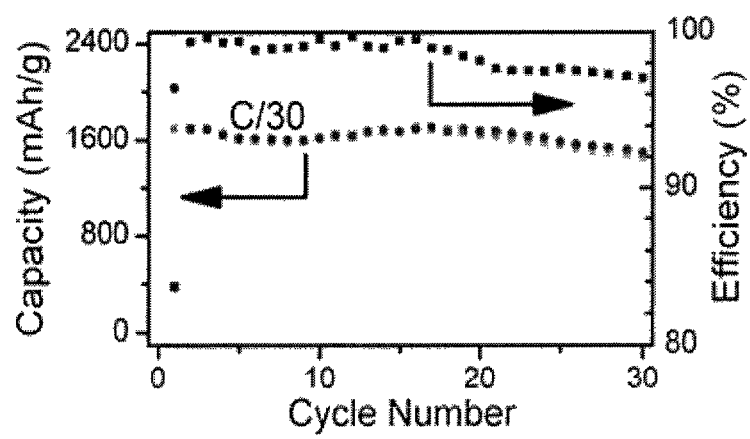
FIG. 15 is a plot showing cycling performance of a working electrode using 4-layer stacked CNT-Si films, according to certain example embodiments of the present disclosure.

FIGS. 13A-13F show the cycling performance and voltage profiles of the CNT-Si films as anode in half cell tests. Each of FIGS. 13A-13D reflect charge and discharge capacity and coulombic efficiency versus cycle number for a half cell using CNT-Si films as working electrode cycled between 1.0 V-0.01 V; the tests were measured with pouch type cells and using constant current charge and discharge with this voltage range of 1.0V-0.01V. The cycling rates were calculated according to the theoretical capacity of silicon (4200 mAh/g) and CNTs (about 400 mAh/g) with a mass ratio of 6:1, where the overall theoretical capacity is about 3600 mAh/g and 1C=3.6 A/g. FIG. 13A is a half cell test of an electrode made of SS mesh supported CNT-Si film. The first 12 cycles were cycled at a rate of C/10, then the rate was increased to C/3 for the following cycles. The cell exhibits a good first cycle coulombic efficiency of 84% and high efficiency 98.5-99.8% after first few cycles. There is a capacity drop about 11% when the cycling rate was increased from C/10 to C/3. The cell has a capacity retention of 90% after 90 cycles at a rate of C/3. It should be noticed here that it only takes the cell about 1.8 hours to charge or discharge at a rate of C/3 because the CNT-Si films have a capacity of about 2000 mAh/g and the cycling rate was calculated according to a theoretical capacity of 3600 mAh/g. FIG. 13*b* shows the cycling performance of about 4 μm thick free-standing CNT-Si film at a rate of C/10. The discharge capacity is 2083 mAh/g at the beginning and remains 1711 mAh/g (or 82%) after 50 cycles. The coulombic efficiency is 86% for the first cycle and greater than 98% throughout the rest cycles. We also stacked multiple layers of these CNT-Si films as anode and obtained higher active material loading density per unit area. FIG. 13C shows the performance of an electrode using two layers of 4 μm thick CNT-Si (free-standing) films at a cycling rate of C/15. This cell shows good coulombic efficiency and has a capacity retention of about 80% after 50 cycles. A four-layer stack of CNT-Si films was also tested and still demonstrated good performance (e.g., as shown in FIG. 15). FIG. 13D shows the cycling of a mixed CNT-SiNP film treated with SiH$_4$ CVD at a rate of C/10. In this film the SiNPs contribute more than 90% of the overall Si content. Only a small amount of SiH$_4$ CVD was needed to coat the CNTs with a-Si and to fuse the SiNPs and CNTs together. With the incorporation of SiNPs, the cell still demonstrate good coulombic efficiency and has a capacity retention of 75% after 50 cycles, showing slightly faster decay compared to those films whose Si content is all a-Si (FIG. 12D vs. FIG. 12B).

FIG. 13E is the voltage profile of a half cell (see cell in FIG. 3B) using free-standing single layer CNT-Si film as the working electrode. The first charge has a long plateau at 0.18 V up to 1200 mAh/g, which is the first lithiation potential pure a-Si. See, e.g., L. F. Cui, R. Ruffo, C. K. Chan, et al., Nano Letters 9, 491 (2009); and J. P. Maranchi, A. F. Hepp, and P. N. Kumta, Electrochemical and Solid State Letters 6, A198 (2003). The sloping region between 1200 mAh/g and 2415 mAh/g is the further lithiation of amorphous Li$_x$Si. Because the first charge did not reach the formation of crystalline Li$_{15}$Si$_4$ (3579 mAh/g), the first discharge has no plateau due to the delithiation of crystalline Li$_{15}$Si$_4$ as observed by previous studies. After the first cycle, the charging and discharging profile shows typical behavior (sloping curves) of Li intercalating with amorphous Li$_x$Si. For further discussion, reference is made to one or more of the following: L. F. Cui, R. Ruffo, C. K. Chan, et al., Nano Letters 9, 491 (2009); L. F. Cui, Y. Yang, C. M. Hsu, et al., Nano Letters 9, 3370 (2009); and M. N. Obrovac and L. J. Krause, Journal of the Electrochemical Society 154, A103 (2007). The average charge potential is ~0.18 V and average discharge potential ~0.4 V, rendering a low average overpotential of ~0.11 V, suggesting that CNT-Si films are good anode material with low charge/discharge voltage hysteresis. FIG. 13F is the voltage profile of a half cell using free-standing CNT-SiNP film treated with $SiH_4$ CVD as working electrode. The first charge has a short plateau at about 0.18 V due to the lithiation potential pure a-Si deposited from $SiH_4$ CVD. Then a second long plateau appears at 0.09V which is the litigation potential of pure c-Si of SiNPs. After the first charge, the profiles of the rest cycles show typical behavior of Li intercalating with amorphous $Li_xSi$ similar to those in FIG. 13E.

Figure 14:
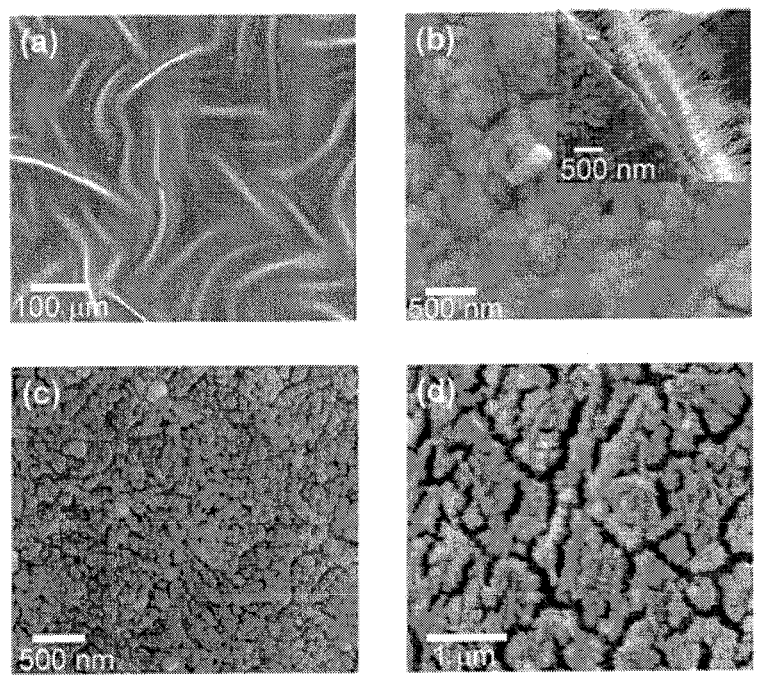

We also investigated the free-standing CNT-Si films (without SiNPs) after battery cycling. FIGS. 14A-14D are SEM images of the free-standing CNT-Si films after different number of cycles. FIG. 14A is a SEM image of the CNT-Si film after 10 cycles, which do not show significant breaking or pulverization. Previous studies on sputtered-on Si films all observed sever pulverization after just several cycles. In this regard, reference may be made to one or more of the following references: J. P. Maranchi, A. F. Hepp, and P. N. Kumta, Electrochemical and Solid State Letters 6, A198 (2003); J. T. Yin, M. Wada, K. Yamamoto, et al., Journal of the Electrochemical Society 153, A472 (2006); S. Ohara, J. J. Suzuki, K. Sekine, et al., Electrochemistry 71, 1126 (2003); and S. Komaba, F. Mikami, T. Itabashi, et al., Bulletin of the Chemical Society of Japan 79, 154 (2006). Islands and aggregates of Si particles were found on the substrates after a few battery cycles. Id. In FIG. 14A ripples caused by repeated Si expansion and shrinkage during $Li^+$ intercalation can be clearly seen in the image. It is likely that the formation of ripples can relax the large strain in the film during $Li^+$ cycling thus reducing the breaking of the film. In this regard, CNT-Si films can be considered advantageous over pure sputtered-on Si films (and endure significant pulverization upon $Li^+$ cycling).

FIG. 14B is a zoom-in SEM image of FIG. 14A. Repeated $Li^+$ insertion and extraction sill causes some damage to film and formation of small Si bumps can been seen on the surface. The inset graph in FIG. 14B is a SEM image at a broken edge of CNT-Si film after 10 cycles, where CNTs sticking out of the edge can be still clearly seen. FIG. 14C is a SEM image of the composite film after 20 cycles. There appears more breaking on the film compared to 10 cycle image. FIG. 14D is a SEM image of the CNT-Si film after 40 cycles, where small cracks can be seen on the surface. However the film does not disintegrate because the CNT network still connect the Si islands together. This proves the advantage of our CNT-Si composite film over pure Si films.

Accordingly and in certain embodiments, CNT-Si composite films up to 4 μm in thickness were synthesized by $SiH_4$ CVD on CNT films. The infiltrated CNT network functions provide good conductivity, flexibility as well as mechanical strength. It can be made on a stainless steel mesh or free standing and used as anode electrodes. SiNPs can also be incorporated in the film to reduce the amount of CVD. This CNT-Si film demonstrates a high specific charge storage capacity (about 2000 mAh/g) and a good cycling life, superior to pure sputtered-on silicon films with similar thickness. The great performance is attributed to the good mechanical strength and conductivity of the composite film, which can maintain structural integrity upon repeated lithium insertion and extraction. The CNT-Si film is still connected by CNT network even if small breaking or cracks appear in the film after cycling. The film was found to form "ripples" after lithium cycling, due to the large strain in Si.

Based upon the above discussion and illustrations, those skilled in the art will readily recognize that various modifications and changes may be made to the present disclosure without strictly following the exemplary embodiments and applications illustrated and described herein. Such modifications and changes may include, for example, incorporating one or more aspects described in the above references and/or applying one or more embodiments thereto, combining embodiments. In addition, the skilled artisan would appreciate from this disclosure that various embodiments herein can be used alone and/or in combination with aspects of other embodiments as described above, and in the Appendix referenced above (and fully incorporated herein). One or more of the elements depicted in the drawings/figures can also be implemented in a more separated or integrated manner, or removed and/or rendered as inoperable in certain cases, as is useful in accordance with particular applications. These and other modifications do not depart from the true spirit and scope of the present disclosure, including that set forth in the following claims.

What is claimed is:

1. An electronic device comprising:
   a carbon nanotube film having a plurality of carbon nanotubes that includes a porous structure;
   an inorganic material configured and arranged to provide a membrane including the plurality of carbon nanotubes embedded within the membrane; and
   a conductive electrode coupled to the carbon nanotube film for conducting current therefrom.

2. The device of claim 1, wherein the porous structure is configured and arranged to maintain arrangement of the carbon nanotubes via interlayer bonding forces, via the plurality of carbon nanotubes, to sustain structural integrity and conductivity of the device, and further comprising a device coating on the carbon nanotubes in the film, the device coating including at least one of
   a charge-mode coating configured to receive ions for storing energy in a charging mode, and
   a discharge-mode coating configured to receive ions in a discharging mode.

3. The device of claim 1, wherein the porous structure includes inter-layered carbon nanotubes forming pores between the nanotubes, and is configured to mechanically support the inorganic material and the conductive electrode of the device.

4. The device of claim 3, wherein
   the carbon nanotube film includes a plurality of p-type carbon nanotubes,
   the inorganic material includes an n-type material, and
   a p-n junction including a portion of each of the nanotubes and the material.

5. The device of claim 3, wherein the inorganic material includes electrode material that forms the conductive electrode.

6. The device of claim 3, further comprising:
   a conduction channel including a portion of the carbon nanotube film; and
   an electrode including an amorphous silicon coating coupled to the carbon nanotube film of the conduction channel.

7. The device of claim 6, wherein the amorphous coating has a thickness of about one micrometer.

8. The device of claim 3, further comprising:
at least one of a cathode material and an anode material coated on the carbon nanotube film; and
an insulative material coated on the carbon nanotube film and configured to electrically insulate the carbon nanotube film.

9. The device of claim 8, wherein the insulative material includes at least one of Silicon and SiN and has at thickness of about 100 nm.

10. The device of claim 8, wherein the carbon nanotube film is a current collector for the at least one of the cathode material and anode material.

11. The device of claim 8, further including a current collector material on the coated carbon nanotube film.

12. The device of claim 8,
wherein the carbon nanotube film is coated with an anode material and forms an anode of a battery,
further including
another carbon nanotube film coated with a cathode material and forming a cathode of the battery, and
an electrolytic separator material between the anode and cathode and configured to pass ions between the respective anode and cathode.

13. The device of claim 8,
wherein the carbon nanotube film is coated with an anode material, and
further including
an anode current collector configured to collect current from the anode material of the carbon nanotube film and forming, with the coated carbon nanotube film, an anode of the battery device,
another carbon nanotube film coated with a cathode material,
a cathode current collector configured to collect current from the cathode material and forming, with the cathode material-coated carbon nanotube film, a cathode of the battery, and
an electrolytic separator material between the anode and cathode and configured to pass ions between the respective anode and cathode.

14. A thin-film cell comprising:
an n-type silicon material;
a thin film on the n-type silicon material and including p-type carbon nanotubes forming a p-n junction with the n-type silicon material, the thin film being configured and arranged to provide a membrane including the carbon nanotubes embedded within the membrane; and
electrodes respectively coupled to the n-type silicon material and the p-type carbon nanotubes and configured to couple current generated at the p-n junction in response to light, the carbon nanotubes forming a porous structure.

15. The cell of claim 14, wherein the p-type carbon nanotubes are a carbon nanotube film, and the n-type silicon material is a layer on the film.

16. The cell of claim 14, further including a load coupled to the electrodes and configured to draw current generated at the p-n junction.

17. An electronic device, comprising:
a carbon nanotube film having a plurality of carbon nanotubes that form a porous structure;
means, including an inorganic material, for providing a membrane including the plurality of carbon nanotubes embedded within the membrane; and
means, coupled to the carbon nanotube film, for conducting current therefrom.

18. The device of claim 1, wherein the porous structure is configured and arranged to maintain arrangement of the carbon nanotubes via van der Waals forces between the plurality of carbon nanotubes, to sustain structural integrity and conductivity of the device.

19. The device of claim 1, wherein the porous structure includes a plurality of pores, each with a respective size in the range of approximately 1-100 nm.

20. The device of claim 1, wherein the porous structure includes a plurality of pores configured and arranged to facilitate transport of electrolytes.

21. The device of claim 1, wherein the carbon nanotube film includes material-filled spaces between the plurality of carbon nanotubes.

22. The device of claim 1, wherein the carbon nanotube film includes material-filled spaces between the plurality of carbon nanotubes, and further comprising a continuous film that fills the spaces.

23. The device of claim 1, wherein the carbon nanotube film includes material-filled spaces between the plurality of carbon nanotubes, and the inorganic material is a continuous film that fills the spaces.

24. The device of claim 1, wherein the plurality of carbon nanotubes are deposited to manifest a layer formed by a deposition of carbon nanotubes, with the plurality of carbon nanotubes crossing each other at a plurality of different angles.

25. The device of claim 17, wherein the porous structure is configured and arranged to maintain arrangement of the carbon nanotubes via van der Waals forces between the plurality of carbon nanotubes, to sustain structural integrity and conductivity of the device.

26. The device of claim 17, wherein the porous structure includes a plurality of pores with sizes of approximately 1-100 nm, and the plurality of pores are configured and arranged to facilitate transport of electrolytes.

27. The device of claim 1, wherein the inorganic material is between 50 nanometers and 10 micrometers in thickness.

28. The device of claim 1, wherein the inorganic material is further configured and arranged to coat and embed the plurality of carbon nanotubes within the membrane.

29. The device of claim 1, wherein the membrane includes an upper surface, and further including another membrane constructed according to the membrane of claim 1, and disposed on the upper surface of the first-recited membrane.

* * * * *